(12) United States Patent
Suzuki

(10) Patent No.: US 6,217,665 B1
(45) Date of Patent: *Apr. 17, 2001

(54) METHOD OF CLEANING SUBSTRATE USING ULTRAVIOLET RADIATION

(75) Inventor: Masaaki Suzuki, Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 56 days.

(21) Appl. No.: 08/743,375

(22) Filed: Nov. 4, 1996

Related U.S. Application Data

(63) Continuation of application No. 08/013,314, filed on Feb. 4, 1993, now abandoned.

(30) Foreign Application Priority Data

Feb. 7, 1992 (JP) .................................... 4-055985

(51) Int. Cl.⁷ .................................... B08B 7/00; B08B 7/04
(52) U.S. Cl. .................................... 134/1; 134/1.3; 134/2; 134/26; 134/30; 134/902
(58) Field of Search .................................... 134/1, 1.1, 1.2, 134/1.3, 2, 26, 30, 902

(56) References Cited

U.S. PATENT DOCUMENTS

| | | | |
|---|---|---|---|
| 4,028,135 | * | 6/1977 | Vig et al. .................................... 134/1 |
| 4,341,592 | * | 7/1982 | Shortes et al. .................................... 134/2 |
| 4,715,392 | * | 12/1987 | Abe et al. .................................... 134/62 |
| 5,068,040 | * | 11/1991 | Jackson .................................... 210/748 |
| 5,078,832 | * | 1/1992 | Tanaka .................................... 134/1 X |
| 5,094,898 | * | 3/1992 | Morita et al. .................................... 428/64 |
| 5,150,239 | | 9/1992 | Watanabe et al. .................................... 359/80 |
| 5,158,100 | * | 10/1992 | Tanaka et al. .................................... 134/105 |
| 5,185,059 | | 2/1993 | Nishida et al. .................................... 156/659.1 |
| 5,198,634 | * | 3/1993 | Mattson et al. .................................... 219/121.43 |
| 5,215,592 | * | 6/1993 | Jackson .................................... 134/1 |
| 5,372,651 | * | 12/1994 | Kodama .................................... 134/26 |
| 5,747,387 | * | 5/1998 | Koizumi et al. .................................... 438/708 |

FOREIGN PATENT DOCUMENTS 63-271938 * 11/1988 (JP) .
2-000315 * 1/1990 (JP) .

OTHER PUBLICATIONS

Valiev et al, Interaction of Short–Wave UV Radiation on Thin Layers of Organic Compounds, Mickroelectronika, vol. 17, No. 6, pp. 522–7, 1988.*

CAS abstract 110:125149 of Valiev et al, Interaction of Short–Wave UV Radiation on Thin Layers of Organic Compounds, Mickroelectronika, vol. 17, No. 6, pp. 522–7, 1988.*

Zafonte et al, UV/Ozone Cleaning for Organic Removal on Silicon Wafers, SPIE Vol. 470, pp. 164–175, 1984.*

Vig, UV/Ozone Cleaning of Surfaces, J. Vac. Sci. Technol. A 3(3), May/Jun. 1985, pp. 1027–1034.*

\* cited by examiner

Primary Examiner—Alexander Markoff
(74) Attorney, Agent, or Firm—Fitzpatrick, Cella, Harper & Scinto

(57) ABSTRACT

Dirt, particularly of inorganic matter, attached to a substrate, such as a glass substrate for liquid crystal devices, is effectively removed by irradiating the substrate with ultraviolet rays including 184.9 nm and 253.7 nm in an oxygen-containing atmosphere in advance of wet cleaning with pure water. As a result, the wet cleaning time and the amount of pure water can be reduced.

24 Claims, 2 Drawing Sheets

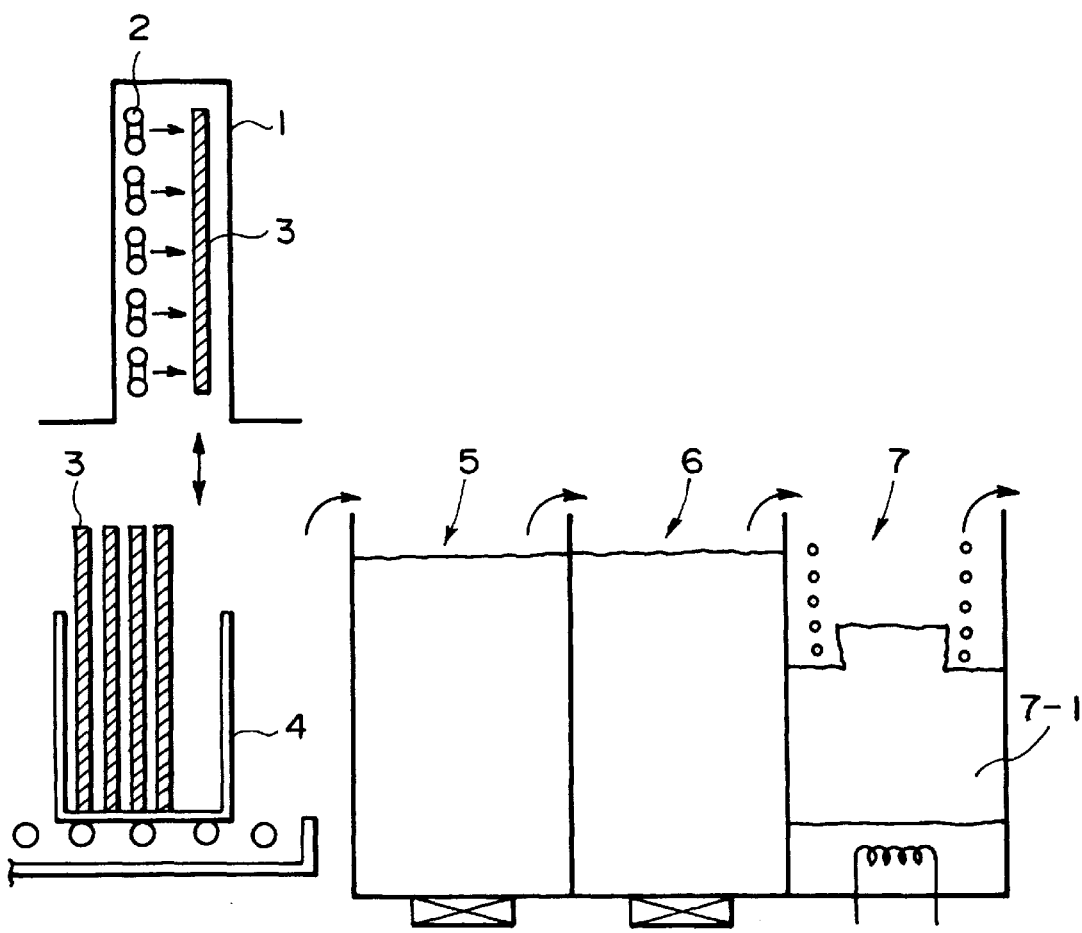
F I G. 1

METHOD OF CLEANING SUBSTRATE USING ULTRAVIOLET RADIATION

This application is a continuation of application Ser. No. 08/013,314, filed Feb. 4, 1993, now abandoned.

FIELD OF THE INVENTION AND RELATED ART

The present invention relates to a method of cleaning substrates, particularly a method of cleaning substrates suitable for cleaning glass substrates for liquid crystal devices wherein dirt on a glass substrate causing an inferior product is removed during a liquid crystal device production process.

There have been known wet-cleaning techniques using pure water for cleaning substrates for precision devices or appliances, such as glass substrates for liquid crystal devices. In the case of cleaning a glass substrate for a liquid crystal device already provided with a pattern of electrodes and before provision of an alignment film, for example, it has been ordinarily practiced to first remove dirt, such as dust and inorganic matter, by a combination of spraying, high-pressure showering and/or ultrasonic cleaning respectively using pure water, optionally with brushing or ultrasonic cleaning with a detergent and cationic pure water as a pretreatment, and drain the water as by an air knife, a spinner or pulling out from warm pure water, or dry the substrate with, e.g., vapor of IPA (isopropyl alcohol).

It is also known to thereafter heat the glass substrate to about 150° C. and irradiate the substrate with ultraviolet rays at wavelengths of 184.9 nm and 253.7 nm so as to have oxygen in air absorb the ultraviolet rays at 184.9 nm to generate ozone and have the ozone absorb the ultraviolet rays at 253.7 nm to generate oxygen radicals, by which organic matter is decomposed and removed.

However, the above-mentioned first washing with pure water for removal of dust or inorganic matter with pure water as by a combination of spraying, high-pressure showering, ultrasonic cleaning, etc., requires some length of time, thus leading to an inferior throughput of the cleaning apparatus or requiring an elongated apparatus in order to retain a high throughput by using the same length of time. Further, a large amount of water is required per sheet of glass substrate, and the cleaning cost is considerably expensive.

Further, if the pre-cleaning by brushing or ultrasonic cleaning using a detergent is performed before the cleaning with pure water, it is possible to obtain a sufficient cleaning effect even if a shorter time is used for the cleaning with pure water. However, for an identical throughput, this additionally requires a cleaning step using a detergent and a rising step, so that the total length of the required cleaning apparatus is not substantially changed. Further, the required amount of pure water is not substantially changed either because the rinsing step after the cleaning with a detergent requires an additional amount of pure water, thus also requiring a high process cost.

SUMMARY OF THE INVENTION

In order to solve the above-mentioned problems, an object of the present invention is to provide a method of cleaning a substrate, whereby dirt, such as inorganic and organic matters, can be effectively removed while shortening the wet cleaning time and reducing the amount of water used.

Another object of the present invention is to provide a method of cleaning a substrate, whereby a glass substrate can be effectively cleaned with a minimum amount of pure water and a short time with a simple apparatus arrangement and without complex process control.

According to the present invention, there is provided a method of cleaning a substrate for removing dirt on the substrate, comprising: irradiating a substrate surface with ultraviolet rays including wavelengths of 184.9 nm and 253.7 nm in an oxygen-containing atmosphere, and then subjecting the substrate to wet cleaning with pure water.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is an illustration of a batch-type cleaning apparatus for use in a method of cleaning a substrate according to the present invention.

DESCRIPTION OF THE PREFERRED EMBODIMENTS

Figure 2:
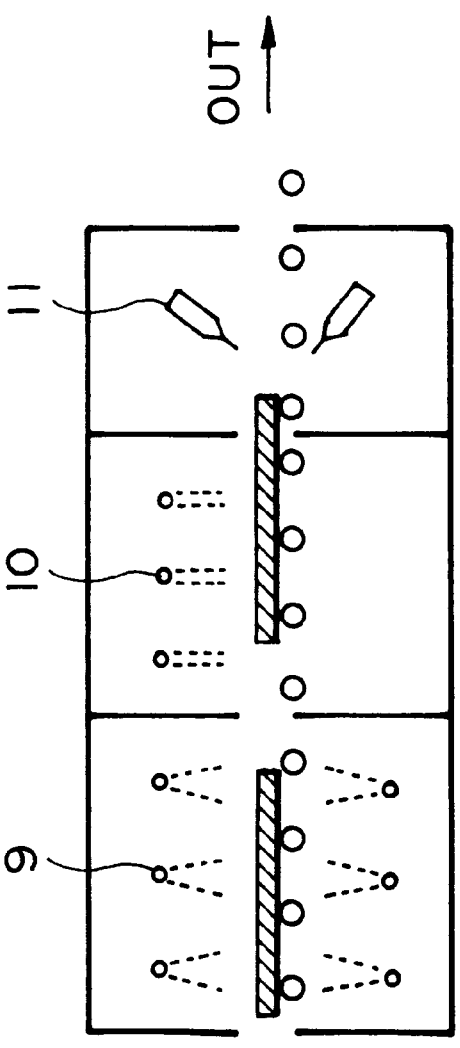
FIG. 2 is an illustration of a sheet-by-sheet type cleaning apparatus for use in a method of cleaning a substrate according to the present invention.
Figure 2:
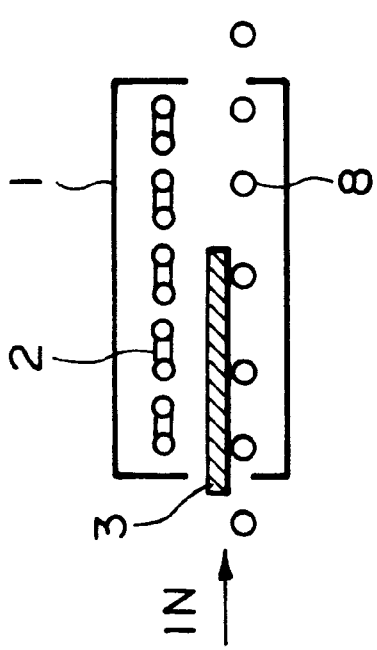

In a preferred embodiment of the present invention, a glass substrate for a liquid crystal device may be cleaned for removal of dirt thereon by first irradiating a surface of the substrate with ultraviolet rays including wavelengths of 184.9 nm and 253.7 nm in an oxygen-containing atmosphere and then subjecting the substrate to wet cleaning with pure water.

More specifically, in the cleaning method for removing dirt (foreign matter) on a glass substrate according to the present invention, immediately before the wet-cleaning with pure water of the substrate, the surface of the substrate is simultaneously irradiated with ultraviolet rays including components with wavelengths of 184.9 nm and 253.7 nm, preferably having peaks at these wavelengths, whereby oxygen in the atmosphere absorbs ultraviolet rays at 184.9 nm to form ozone and the ozone absorbs ultraviolet rays at 253.7 nm to form oxygen radicals, with which the dirt or organic matter on the glass substrate is chemically removed and the surface tension of the glass surface is reduced to improve the wettability in advance to enhance the effect of cleaning dirt or inorganic matter in a subsequent cleaning step with pure water.

The irradiation means for issuing the abovementioned wavelengths may be any provided that they include sufficient amount of the above-mentioned wavelengths. Examples of which may include: discharge lamps, such as low-pressure mercury lamps, black-light fluorescent lamps, fluorescent chemical lamps, mercury arc lamps, and xenon arc lamps; and excimer lasers, such as KrF and ArF excimer lasers.

Such irradiation means can be combined in a plurality as desired. It is also possible to use separate irradiation means for a wavelength of 184.9 nm and a wavelength of 253.7 nm.

The irradiation intensity of the ultraviolet rays can be varied depending on the degree of soiling or dirt on the substrate or desired cleanness of the substrate but may generally preferably be at least 0.2 J/cm² more preferably at least 0.4 J/cm².

The irradiation of the substrate with ultraviolet ray may be performed in an oxygen-containing atmosphere, which may conveniently be atmospheric air or preferably be an oxygen atmosphere or an atmosphere containing oxygen diluted with an inert gas, such as Ar or $N_2$ so as to further obviate unnecessary by-products due to irradiation with ultraviolet rays.

The time after the ultraviolet irradiation until the cleaning with pure water may generally be at most 30 min., preferably at most 10 min. In other words, the cleaning with pure water may preferably be performed when the substrate surface shows a contact angle with water of at most 10 degrees, preferably at most 5 degrees. This means that the cleaning with pure water is started while the substrate surface shows good wettability with pure water.

Anyway, standing for a long time after the ultraviolet irradiation should be obviated since the effect of the ultraviolet irradiation is lost.

Hereinbelow, the present invention will be described with reference to an embodiment shown in the drawings.

EXAMPLE 1

FIG. 1 is an illustration of an outline of a batch-type cleaning apparatus for use in a method of cleaning substrates for, e.g., liquid crystal devices. Referring to FIG. 1, the apparatus included an ultraviolet ray-irradiation unit 1 wherein 7 U-shaped low pressure mercury lamps of 110 watt. ("UVU-110", available from K.K. Oak Seisakusho) having two peaks and wavelengths of 184.9 nm and 253.7 nm were arranged. Into the unit 1, glass substrates 3 (300 mm×300 mm×1.1 mm-t) each provided with a surface pattern of electrodes and held in a cleaning cassette 4 were supplied sheet by sheet for irradiation with ultraviolet rays for 30 sec. per sheet from a distance of about 10 mm.

Then, by an automatic conveying machines, 5 sheets of the glass substrates 3 subjected to the ultraviolet irradiation together with the cleaning cassette 4 were dipped and washed for about 180 sec. in a first ultrasonic cleaning vessel 5 using pure water, and then dipped and washed for about 180 sec. in a second ultrasonic cleaning bath 6, followed by drying with IPA (isotropyl alcohol) vapor in a chamber 7-1 in a drying vessel 7. The substrates thus cleaned were then taken out from the cleaning apparatus and subjected to coating with a polyimide forming liquid by flexographic printing, whereby a clear polyimide film was found to be formed thereon. The first and second cleaning vessels 5 and 6 were respectively supplied with 500 liters/hour of pure water and, as a result of simple calculation, the substrates were sufficiently cleaned with pure water in a small amount of about 8 liters/sheet.

In contrast thereto, the same level of cleaning required about 16 liters/sheet without the preliminary ultraviolet irradiation prior to the cleaning with pure water.

For evaluating the cleaning performance, glass substrates 3 were intentionally soiled with silica latex particles with an average particle size of 1.2 μm at a rate of about 300 particles/mm$^2$ and then cleaned in the above-described manner, whereby an extremely good removal rate of 98% was obtained.

In contrast thereto, when substrates intentionally soiled similarly as above were cleaned without being introduced into the ultraviolet ray irradiation unit 1, i.e., by directly introduced into the first cleaning bath 5, the second cleaning bath 6 and the drying bath 7, a removal rate of only 92% was obtained showing a clearly inferior cleaning state than in the case where the ultraviolet irradiation was performed in advance of the cleaning with pure water. Further, in order to obtain a removal rate of 98%, it was necessary to effect the cleaning sequence though the vessels 5–7 two cycles under identical conditions.

EXAMPLE 2

FIG. 2 is an illustration of a sheet-by-sheet cleaning apparatus for practicing a cleaning method for liquid crystal device substrates. Referring to FIG. 2, the apparatus included an ultraviolet ray-irradiation unit 1 wherein 5 U-shaped 110 watt.-low-pressure mercury lamps ("UVU-110", available from K.K. Oak Seisakusho) having two peaks at wavelengths of 184.9 nm and 235.7 nm were arranged. Through the unit 1, glass substrates 3 (300 mm×300 mm×1.1 mm-t) each provided with a transparent electrode film (ITO) on the entirety of one face were conveyed continuously sheet by sheet to be irradiated with ultraviolet rays from a height of 10 mm for about 40 sec.

Then, the substrates 3 were subjected to wet cleaning by being sprayed with warm pure water at about 30° C. from a spray nozzle 9 and then subjected to high-pressure showering of pure water at about 15 kg.f/cm$^2$ from a shower nozzle 10, followed by draining with air knife 11. The thus cleaned substrates were then satisfactorily coated with a positive-type photoresist by roller coating, followed by satisfactory patterning of the ITO film.

For evaluating the cleaning performance similarly as in Example 1, substrates 3 were intentionally soiled with silica latex particles with an average particle size of 1.2 μm at a rate of about 300 particles/mm$^2$ and then cleaned in the above-described manner, whereby a good removal rate of 96% was obtained in the case where the ultraviolet irradiation was performed before the cleaning with pure water. In contrast thereto, an inferior cleaning rate of about 89% was measured in the case where the wet cleaning alone was performed.

EXAMPLE 3

The substrates cleaned in Examples 1 and 2 were again subjected to irradiation with ultraviolet rays in an oxygen-containing atmosphere under similar conditions as in the respective Examples, whereby further effective cleaning of the substrate surfaces could be performed.

As described hereinabove, according to the present invention, a substrate surface is irradiated with ultraviolet rays including wavelengths at 184.9 nm and 253.7 nm in an oxygen-containing atmosphere immediately before wet-cleaning with pure water, whereby it becomes possible to increase the removal rate of dirt, particularly of inorganic matter. As a result, it is possible to shorten the wet-cleaning time and decrease the amount of pure water, leading to a decrease in production cost.

What is claimed is:

1. A method of producing a liquid crystal device which includes a glass substrate surface having thereon a transparent electrode, said method using pure water as a sole aqueous washing medium and comprising:

a first step of providing said glass substrate with said transparent electrode, said substrate surface also having dirt thereon, said dirt comprising at least one of organic matter and inorganic matter and being on said surface prior to washing with any aqueous washing medium, wherein a second step of irradiating with ultraviolet rays the glass substrate surface with said transparent electrode and said dirt prior to washing with any aqueous washing medium, said ultraviolet rays including wavelengths of 184.9 nm and 253.7 nm and being applied in an oxygen-containing gas atmosphere, thereby causing oxygen radicals to act on the dirt and the glass substrate provided with said transparent electrode; and a third step following the second step without any intervening step, of washing with said pure water the irradiated glass substrate provided with the transparent electrode and irradiated dirt thereon subjected to action of the oxygen radicals, said washing with said pure water being performed under application of ultrasonic wave.

2. A method according to claim 1, wherein said oxygen-containing atmosphere comprises atmospheric air.

3. A method according to claim 1, wherein said ultraviolet rays are generated from a discharge lamp.

4. A method according to claim 1, wherein said ultraviolet rays are generated from an excimer laser.

5. A method according to claim 1, wherein said ultraviolet rays are generated from a plurality of sources.

6. A method according to claim 1, wherein at least one of the wavelengths of 184.9 nm and 253.7 nm is a peak wavelength.

7. A method according to claim 1, wherein the substrate is irradiated with ultraviolet rays at an intensity of at least 0.2 J/cm$^2$.

8. A method according to claim 1, wherein the substrate is subjected to the third step of washing with pure water within 10 minutes after the irradiation with ultraviolet rays.

9. A method according to claim 1, wherein said substrate surface is subjected to said third step of washing with pure water when the substrate surface shows a contact angle with water of at most 10 after the irradiation with ultraviolet rays.

10. A method according to claim 1, wherein said transparent electrode comprises indium tin oxide.

11. A method according to claim 1, wherein the substrate after the third step of washing with pure water is again irradiated with ultraviolet rays.

12. A method according to claim 11, wherein the ultraviolet rays applied after the third step of washing with pure water include wavelengths at 184.9 nm and 253.7 nm.

13. A method of producing a liquid crystal device according to claim 1, further comprising:

a fourth step of forming a polyimide alignment film over the transparent electrode on the glass substrate after the third step of washing with water.

14. The process according to claim 1, wherein the entire surface of said substrate is irradiated with UV rays and subjected to the third step of washing with pure water.

15. The process according to claim 8, wherein the entire surface of said substrate is irradiated with UV rays and subjected to the third step of washing with pure water.

16. The process according to claim 13, wherein the entire surface of said substrate is irradiated with UV rays and subjected to the third step of washing with pure water.

17. A method of producing a liquid crystal device according to claim 1, further comprising:

a fourth step of drying with vapor of isopropyl alcohol the glass substrate after the third step of washing with pure water; and a fifth step of forming a polyimide alignment film over the transparent electrode on the glass substrate after the fourth step.

18. A method according to claim 1, 13 or 14, wherein the dirt on the glass substrate comprise both organic matter and inorganic matter.

19. A method according to claim 9, wherein said contact angle is at most 5°.

20. A method according to claim 1, wherein said glass substrate coated with a transparent electrode film and having dirt on a surface thereof is subjected to said third step of washing with pure water prior to a fourth step of coating with a photoresist to pattern said transparent electrode film.

21. A method according to any one of claims 1, 13, 17 and 20, wherein the glass substrate is washed by dipping within a bath of pure water in the third step.

22. A method according to any one of claims 1, 13, 17 and 20, wherein the glass substrate is washed by showering with pure water in the third step.

23. A method according to claim 21, wherein said oxygen containing gas atmosphere is atmospheric air.

24. A method according to claim 23, wherein said atmospheric air is diluted with an inert gas.

* * * * *

UNITED STATES PATENT AND TRADEMARK OFFICE
CERTIFICATE OF CORRECTION

PATENT NO.    : 6,217,665 B1
DATED         : April 17, 2001
INVENTOR(S)   : Masaaki Suzuki It is certified that error appears in the above-identified patent and that said Letters Patent is hereby corrected as shown below:

Column 1,
Line 51, "rising" should read -- rinsing --.

Column 3,
Line 24, "included" should read -- includes --;
Line 26, "watt." should read -- watts. --;
Line 33, "machines," should read -- machine, --; and
Line 39, "(isotropyl" should read -- (isopropyl --.

Column 4,
Line 8, "included" should read -- includes --; and
Line 11, "235.7 nm" should read -- 253.7 nm --.

Column 5,
Line 32, "10" should read -- 10º --; and
Line 40, "at" should read -- of --.

Column 6,
Lines 4, 7 and 10, "The process" should read -- A method --; and
Line 37, "oxygen" should read -- oxygen- --.

Signed and Sealed this

Eighteenth Day of February, 2003

JAMES E. ROGAN
*Director of the United States Patent and Trademark Office*